United States Patent
Chen et al.

[11] Patent Number: 5,861,775
[45] Date of Patent: Jan. 19, 1999

[54] SIGNAL CONDITIONING CIRCUIT FOR LOW AMPLITUDE, HIGH COMMON MODE VOLTAGE INPUT SIGNALS

[75] Inventors: Chingchi Chen, Ann Arbor; Venkateswara Anand Sankaran, Farmington Hills, both of Mich.

[73] Assignee: Ford Global Technologies, Inc., Dearborn, Mich.

[21] Appl. No.: 784,696

[22] Filed: Jan. 16, 1997

[51] Int. Cl.[6] .................................. H03F 3/45; G05F 1/00
[52] U.S. Cl. ........................ 330/69; 318/678; 330/156; 330/258
[58] Field of Search ............................ 330/69, 156, 258; 318/650, 678, 679, 681

[56] References Cited

U.S. PATENT DOCUMENTS

| | | | |
|---|---|---|---|
| 3,423,689 | 1/1969 | Miller et al. | 330/69 |
| 3,806,787 | 4/1974 | Erler | 318/689 X |
| 4,132,954 | 1/1979 | Sidhu | 330/69 X |
| 4,138,641 | 2/1979 | Karlin et al. | 324/123 |
| 4,152,659 | 5/1979 | Gordon | 330/9 |
| 4,242,741 | 12/1980 | Parrish | 367/21 |
| 4,459,528 | 7/1984 | Nola | 318/729 |
| 4,551,687 | 11/1985 | Lukens | 330/258 |
| 4,659,997 | 4/1987 | Ferland et al. | 330/258 X |
| 5,043,675 | 8/1991 | Gilbert | 330/258 |
| 5,406,223 | 4/1995 | Vulih et al. | 330/258 |

OTHER PUBLICATIONS

Analog Devices, "Low Cost, Miniature Isolation Amplifiers, AD202/AD204", Technical Bulletin.

Burr–Brown, "Precision Lowest Cost Isolation Amplifier", ISO122P, Burr–Brown IC Data Book Supplement, vol. 33b.

Power Motion, "Isolation Amplifiers And Hall Effect Devices Compete As Current Feedback Solutions", by Drew Plant, Hewlett Packard, San Jose, CA, Mar. 1966.

"Methods Of Current Measurement", Sensors, Oct. 1996, pp. 99–105.

*Primary Examiner*—James B. Mullins
*Attorney, Agent, or Firm*—Paul K. Godwin; Roger L. May

[57] ABSTRACT

A cost-effective conditioning circuit for extracting a weak, floating, wide-band signal with a low common-mode voltage from noisy environments is proposed that includes a high gain single ended operational amplifier to increase the amplitude of the signal. A simple, cost-effective approximately unity gain differential amplifier stage is used to level-shift the signal down to the desired reference potential. A typical application is a motor drive system, where the signals to be measured are bi-directional motor currents.

7 Claims, 4 Drawing Sheets

SIGNAL CONDITIONING CIRCUIT FOR LOW AMPLITUDE, HIGH COMMON MODE VOLTAGE INPUT SIGNALS

TECHNICAL FIELD

This invention relates to a low cost signal conditioning circuit for converting a signal having low amplitude, floating, wide bandwidth characteristics with high common-mode noise to a relatively large, low distortion, ground referenced output signal with full-range, bi-directional common-mode rejection capability.

BACKGROUND ART

Feedback control is an important technique for obtaining high quality servo responses. To monitor system operation, sensors are used to observe the desired signals, which could be temperature, torque, speed, current, voltage, etc. An ideal sensor, accompanied with a related signal conditioning circuit, should have the following characteristics:

(a) cost-effective;

(b) compact size and flexible packaging capability;

(c) accuracy over a temperature range from $-40°$ to $+125°$ C. with high bandwidth;

(d) high common-mode rejection capability;

(e) a ground referenced output for the controller stage;

(f) minimum offset error; and (e) minimum power consumption.

Unfortunately, most sensors cannot satisfy all of these requirements, and most sensors (e.g., thermal couples) inherently output very low amplitude signals. In addition, due to the existence of wideband, common-mode noise in the harsh automotive environment, the sensor signals are distorted. To deal with these situations, sensors with inherent electrical isolation (e.g., hall effect sensors for electric current measurement) or extra isolation amplifier stages are inserted to reject common-mode noise. However, high cost and wide operating temperature range, cause these techniques to often be unacceptable for automotive applications.

To measure a floating signal with wide bandwidth, a few well-known techniques have been used in the past. For example, if the common-mode voltage is within a few volts and the desired signal is large, a high quality differential amplifier stage, such as shown in FIG. 1 has been used that includes a high performance operational amplifier 10 and a networks of matched resistor 12–22. The ideal output of this circuit can be expressed by the following equation:

Assume $R_{12}=R_{14}$, $R_{16}=R_{18}$, and $R_{20}=R_{22}$, then $$(V_{out})_{ideal} = G_{ideal} V_{sig} \quad (1)$$

where $$G_{ideal} = \frac{R_{14}}{R_{12}} \quad (2)$$

In FIG. 1, $V_{bias}$ is an optional bias source to shift the amplifier input voltages to desired ranges, and $R_{20}$, $R_{22}$ form an optional resistor network for attenuating the common-mode input voltage. For example, if the common-mode voltage $V_{cm}$ is hundreds of Volts, attenuation is necessary to reduce the amplifier terminal voltages to the typical $\pm 10$ Volts range.

If the resistors and the operational amplifier are not perfect, the actual output voltage in the worst case can be approximated by:

$$\begin{aligned} V_{out} &\cong G_{ideal} V_{sig} + [4(\%R)(G_{ideal}V_{cm} + G_2 V_{bias}) + G_3(V_{os} + I_{os} R_{eq})] \quad (3) \\ &= (V_{out})_{ideal} + \text{ERROR} \end{aligned}$$

where
ERROR=$4 (\%R) (G_{ideal}V_{cm}+G_2 V_{bias})+G_3(V_{OS}+I_{OS}R_{eq})$;
$(\%R)$ is the tolerance of resistors;
$V_{OS}$ is the offset voltage of the operational amplifier;
$I_{OS}$ is the offset current of the operational amplifier;
$R_{eq}=R_{12}//R_{14}//R_{20}$=equivalent parallel resistance of these three resistors,
and $$G_2 = \frac{R_{14}}{R_{20}}, \quad (4)$$

$$G_3 = \frac{R_{12}R_{14}+R_{12}R_{10}+R_{14}R_{20}}{R_{12}R_{20}} = 1 + G_{ideal} + G_2$$

This equation also shows how the output error may be reduced:

1. Use precision, matched resistors (or resistor networks). However, resistors with tolerance better than 1% are expensive. An alternative way is to sort out 1% resistors to get matched resistor pairs to approach 0.2% or even o.1% accuracy. Better accuracy beyond this is difficult without excessive cost penalty.

2. Reduce $G_{ideal}$. However, this parameter is dictated by how small the input signal is and how big an output amplitude is desired.

3. Reduce the common-mode voltage. However, this is mainly decided by the structure and operation of the system.

4. Select precision amplifier to reduce $V_{OS}$ and $I_{OS}$. However, this will normally increases the cost significantly.

The following typical numbers will provide a better understanding of which parameter(s) dominate(s) the output error:
$(\%R)=0.1\%$ (0.001)
$V_{OS}=2$ mV
$I_{OS}=100$ nA
$R_{eq}=10$ K$\Omega$
and assume
$V_{cm}=10$ V, $V_{bias}=0$ V
and
$G_{ideal}=10$, $G_2=0$, $G_3=11$
then, the error output voltage is:

$$\begin{aligned} \text{ERROR} &= 4 (\%R) (G_{ideal}V_{com} + G_2 V_{bias}) + G_3 (V_{os}+I_{ox}R_{eq}) \\ &= 0.004 (10*10V + 0) + 11 (2mV + 100nA*10K), \\ &= 0.004*100V + 11 * 3mV = 0.43V \end{aligned}$$

This result shows that the common mode voltage and the tolerance of resistors are the major error contributors. If the common-mode voltage cannot be reduced, the only choice is to increase the accuracy of resistors. Unfortunately, this becomes impractical when the common-mode voltage is too high or the error tolerance is too tight. Under this situation, isolation amplifiers are normally chosen to achieve good performance, and various schemes are currently available for this purpose in the market. They are transformer-coupled isolation amplifiers, Sigma-delta modulation opto iso-amps and capacitively coupled iso-amps.

Transformer-coupled isolation amplifiers provide very good galvanic isolation, very high signal gain and reasonable offset, but the frequency bandwidth is limited to a few Khz, and the cost is high compared to other products.

One of the main limitations of the opto isoamps is the operating temperature range. The other limitation is the output common-mode voltage range which will be further amplified if the output requires amplification to meet the controller requirements. This would require calibration of every unit and would be expensive. Also, this approach requires 5 V power supplies and regulators since the automotive battery voltage is typically 12 volts. All of these requirements increase cost. Opto iso-amps also have built in propagation delays that may present a problem for very high frequency operation.

One of the limitations of the capacitively coupled isolation amplifiers is the ripple voltage at the carrier frequency that is amplified by the post amplifier circuits. Also, capacitively coupled systems do not have high input to output common mode transient rejection.

Some sensors are inherently isolated, but have limitations that prevent high performance or operation in harsh applications. For example, both current transformers (CTs) and hall-effect current sensors have no conductive connection to the measured circuit. However, the CTs cannot measure dc currents, and the hall sensors are normally bulky, cannot work in the extended automotive temperature range, and are not very effective in small current measurement. Also, both sensors introduce additional stray inductance to the measured circuits.

SUMMARY OF THE INVENTION

In accordance with the present invention, a cost-effective method of extracting weak, floating, wide-band signals from noisy environments is proposed. The technique is very suitable for low voltage applications (<approximately 50 V, mostly automotive) in processing feedback signals without galvanic isolation requirements. Fortunately, galvanic isolation between the power stage and controller stage is not required for 12 V to 48 V automotive applications.

The proposed novel technique amplifies the weak input signal using a local amplifier to increase the amplitude of the signal. Since the local amplifier need not deal with common mode voltage, it is easily designed to have high gain, wide bandwidth, and-low distortion, at a very attractive cost. Then, with the increased amplitude, a simple, cost-effective differential amplifier stage is used to level-shift the signal down to the desired reference potential. From the previous example, it is known that the offset voltages and the offset current are not the major contributors to the output error, unless they and the gains are extremely high. Even better, with the existence of the first stage, the gain of the second stage can be significantly reduced, making the output insensitive to resistor tolerance and the amplitude of the common-mode voltage.

BRIEF DESCRIPTION OF THE DRAWINGS

A more complete understanding of the present invention may be had from the following detailed description which should be read in conjunction with the drawings in which.

DETAILED DESCRIPTION OF PREFERRED EMBODIMENT

Figure 1:
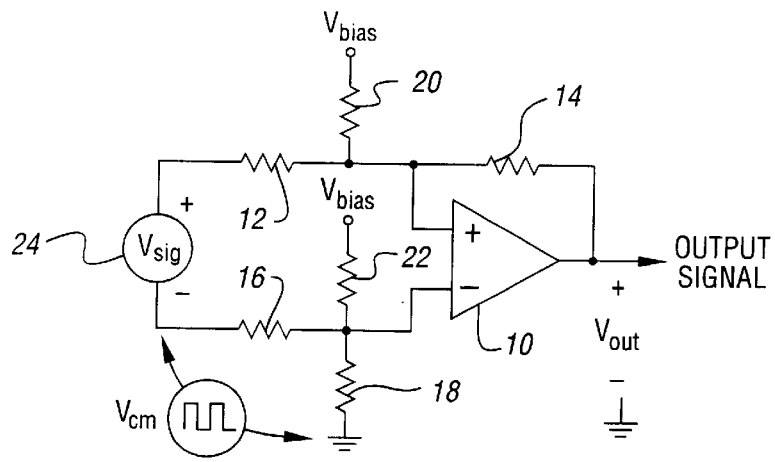
FIG. 1 shows a high performance operational amplifier and matched resistor network used to implement a high quality differential amplifier stage.
Figure 2:
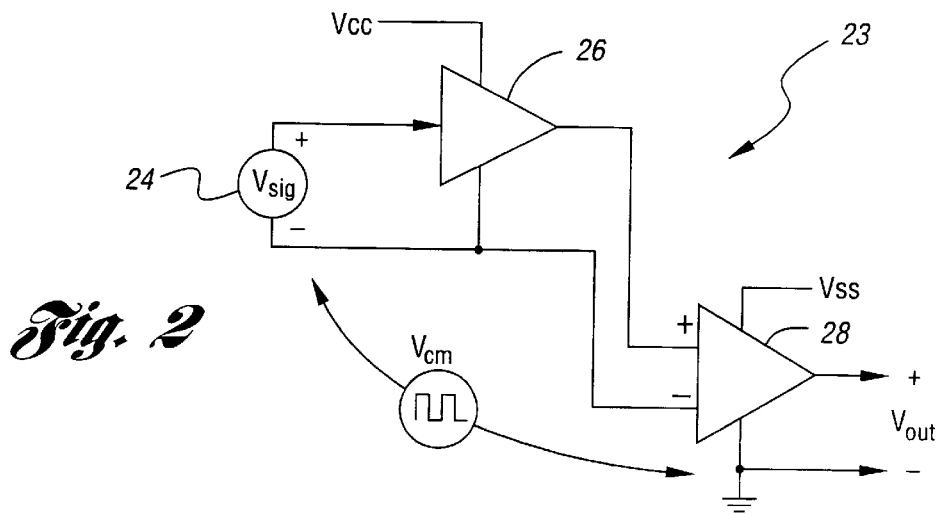
FIG. 2 show the signal conditioning circuit of the present invention.

Referring now to FIG. 2, the signal conditioning circuit of the present invention for processing weak signals in accordance with the present invention is generally designated 23. The weak measured signal 24 is amplified by a local amplifier 26 to increase its amplitude. The local amplifier 26 need not deal with common mode voltage, it can be easily designed to have high gain, wide bandwidth, and low distortion, at a very attractive cost. Then, with sufficient amplitude, a simple, cost-effective differential amplifier stage 28 can be used to level-shift the signal down to the desired reference potential. Under this scheme, the actual output voltage can be expressed by the following equation:

$$V_{out} \cong G_{26}G_{28}V_{sig} + \quad (5)$$
$$[4(\% R)(G_{28}V_{cm} + G_2 V_{bias}) + (1 + G_{26})(V_{os1} + I_{os1}R_{eq1}) +$$
$$G_3(V_{os2} + I_{os2}R_{eq2})]$$
$$= (V_{out})_{ideal} + \text{ERROR}$$

where $G_{26}$ and $G_{28}$ are gains of these two amplifier stages 26 and 28 respectively, under ideal condition, and $V_{OS1}$, $V_{OS2}$, $I_{OS1}$, and $I_{OS2}$ are the offset voltages and currents of these two stages respectively. From the previous example, it is known that the offset voltages and the offset current are not the major contributors to the output error, unless they and the gains are extremely high. Even better, with the existence of the first stage, the gain of the second stage can be significantly reduced, making the output insensitive to resistor tolerance and the amplitude of the common-mode voltage. The following are typical numbers to reveal the significance of this technique:

$$(\% R) = 0.1\% (0.001)$$
$$V_{os1} = V_{os2} = 2 \text{ mV}$$
$$I_{os1} = I_{os2} = 100 \text{ nA}$$
$$R_{eq1} = R_{eq2} = 10 \text{ K}\Omega$$

and assume
$V_{cm}=10$ V, $V_{bias}=0$ V $G_{26} = 10$, $G_{28}=1$, $G_2=0$ and $G_3=2$
then, the error output voltage is:

$$\text{ERROR} = 0.004 (10 \text{ V} + 0) + 12 (2 \text{ mV} +$$
$$100 \text{ nA}*10\text{K}) + 2 (2 \text{ mV} + 100 \text{ nA}*10 \text{ K})$$
$$= 0.04*10 \text{ V} + 16 * 3 \text{ mV} = 0.082 \text{ V}$$

This example shows significant reduction in output error voltage compared with the previous example, and this effect will be much noticeable if the required gain is higher. Therefore, this example shows that two low cost amplifying stages can be combined to replace more expensive approaches used in the past. The first stage provides high gain and the second stage provides common-mode voltage rejection and level shifting, resulting in overall cost saving and performance improvement. The low cost of the first stage is attributable to the fact that it is a single ended amplifier.

Figure 3:
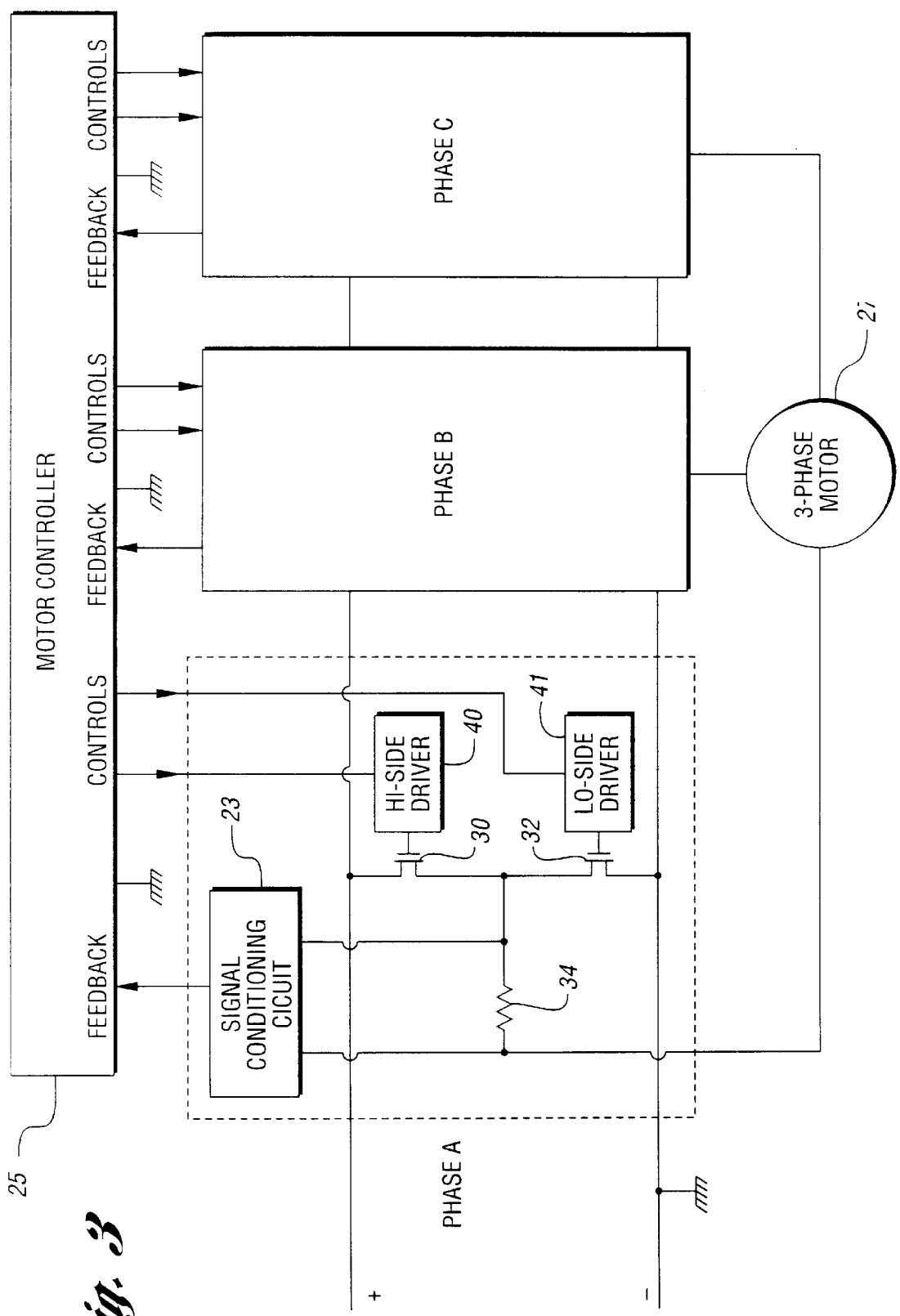
FIG. 3 shows the signal conditioning circuit of the present invention applied in a high performance automotive application, for the purpose of motor current sensing.

FIG. 3 shows a typical application of the signal conditioning circuit 23 of the present invention in a motor drive system, where the signals to be measured are motor currents and the output of the circuit 23 is applied to the feedback input of a motor controller 25. A well known solution is to use respective small-valued resistors, such as indicated at 34, in series with leads of a three phase motor 27. The phases A, B, C are controlled by respective control pulse width modulated signals applied to the gate electrodes of electronic switches 30 and 32 through high side and low side drivers 40 and 41, respectively. The voltage drops across these sense resistors are directly proportional to the respective motor currents. This strategy yields very high performance, at very low cost, and with reasonable power loss from the resistors if the voltage drops are small. However, the signals to be measured are floating with respect to the ground, meaning level-shifting techniques are required to transform these signals to a desired reference potential. Also, the voltage between the measured points to the reference ground could be hundreds of volts, which means the level-shifting circuit must withstand this voltage without sacrificing performance. Also, the electronic switches 30 and 32 are normally driven fully on or fully off at fairly high frequency (tens of kilohertz), meaning the level-shifting circuit should possess very high performance up to megahertz range.

Figure 4:
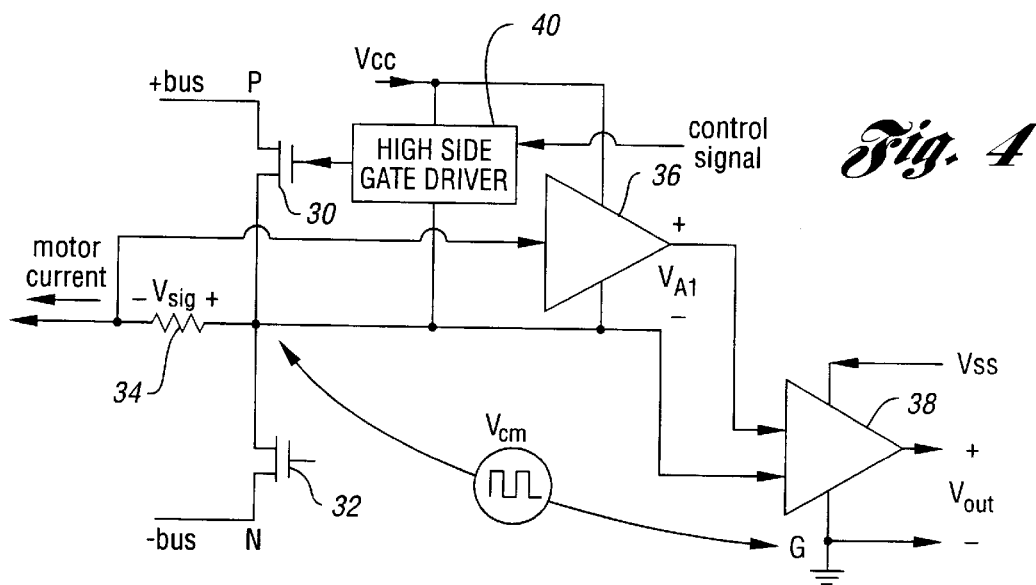
FIG. 4 is a more detailed circuit diagram of the signal conditioning circuit of the present invention as applied to the motor current sensing application of FIG. 3.

A portion of the motor current sensing circuit of FIG. 3 is shown in FIG. 4, including the current sensing resistor 34, as well as further details regarding the conditioning circuit 23 comprising amplifier 36, and differential output stage 38. Resistor 34 is for gauging the motor current, and the amplifier 36, a low cost, single ended operational amplifier stage provides enough gain to boost the weak signal across resistor 34. Since operational amplifiers naturally have very high gain, very wide frequency bandwidth, and reasonable offset voltage, only tens of millivolts is required across resistor 34 to yield enough voltage, $V_{36}$, from the first stage (e.g., around ten volts peak to peak) with fairly high fidelity to the measured current at very reasonable cost. Moreover, since this amplifier stage is at the same voltage potential with the high-side gate drive circuit 40 for the switch 30, no additional power supplies are required for supporting its operation. However, since the output voltage is still floating with respect to ground, further steps are required to shift this signal down to the desired level.

If the common-mode voltage is within tens of volts, as occurs in automotive or small to medium sized Uninterruptable Power Supply (UPS) applications, and also if the signal has been amplified to a sufficient magnitude, a low cost, low gain differential amplifier stage 38 is sufficient to level-shift the signal down to the desired ground level with fairly high accuracy at low cost.

Figure 5:
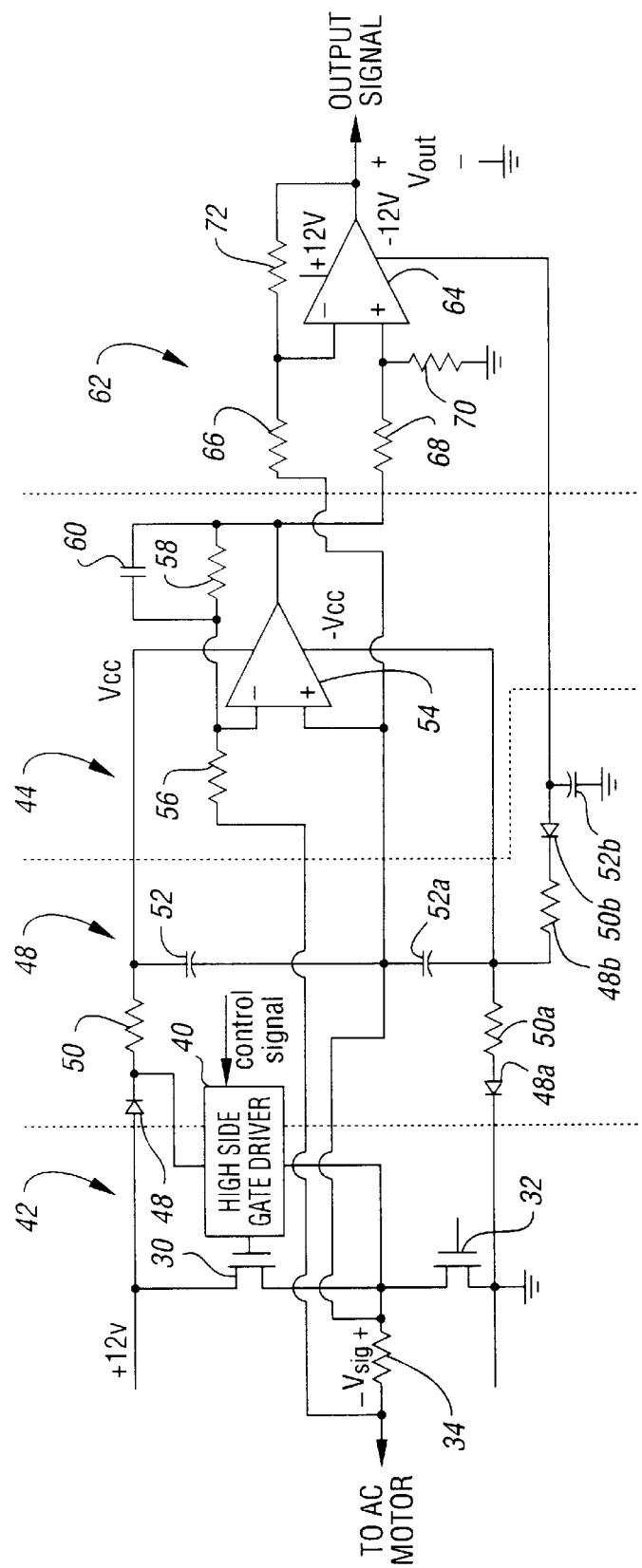
FIG. 5 is a detailed circuit diagram of bipolar version of the signal conditioning circuit of the present invention where the motor drive is powered by the 12 V vehicle battery, and a motor phase is regulated by electronic switching.
Figure 6:
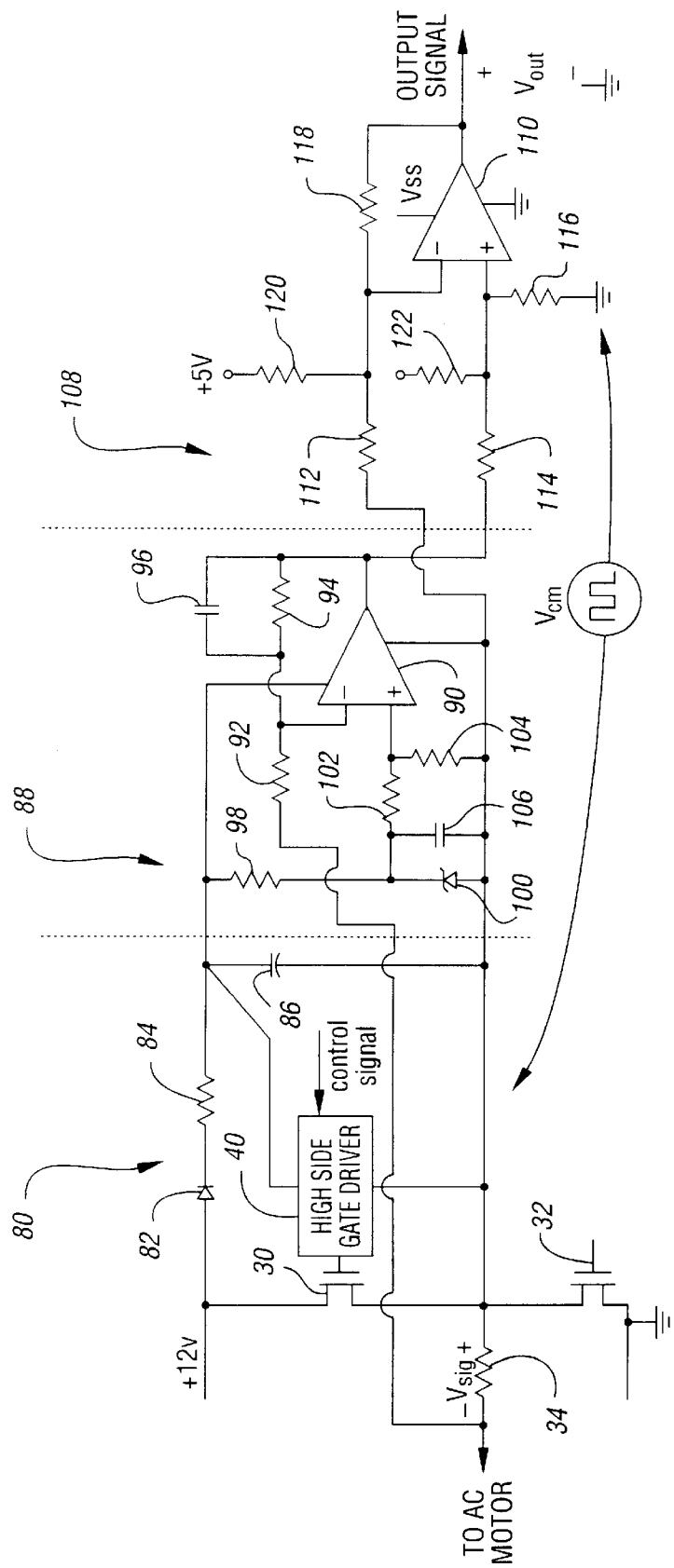
FIG. 6 is a unipolar version of the signal conditioning circuit of the present invention supporting the usage of single-supply operational amplifiers.

Detailed circuit implementations are shown in FIGS. 5 and 6. FIG. 5 shows a bipolar implementation of the amplifier which uses a double boot-strap technique to provide dual power supplies for the amplifier stages, and FIG. 6 shows a unipolar implementation which provides additional cost savings.

Referring now to the detailed circuit implementation shown in FIG. 5, a three-phase motor is powered from a power stage generally indicated at 42 connected to the 12 V automobile battery. In order to obtain floating power supplies for the high-side switch 30 and the high gain amplifier stage 44, a boot-strap circuit 46 is used, including diode 48, resistor 50 and capacitor 52, for supplying positive floating voltage $V_{CC}$, and a diode 48a, resistor 50a, and capacitor 52a for supplying negative floating voltage $-V_{CC}$. The amplifier stage 44 includes amplifier 54, such as the LF411, resistors 56 and 58 and capacitor 60. The purpose of capacitor 60 is to remove high-frequency noise which distorts the profile of the signal waveform, and the high gain (high ratio of resistor 58 to resistor 56) is essential to relieve the burden of the second amplifier stage. Since amplifier 54 sits at the same potential as the gate drive for 30, both can share the same power source. Also, this technique can be extended using diodes 48b, resistor 50b, and capacitor 52b to provide a negative power supply of −12 V for the ground referenced differential amplifier stage generally indicated at 62. The amplifier stage 62 comprises a second LF411 amplifier 64, and resistors 66–72. Since the common-mode voltage is around 10 Volts, an approximately unity differential gain is sufficient to sustain the common-mode input voltages and to level-shift the desired signal.

FIG. 6 shows another embodiment of the invention, which supports the usage of single-supply operational amplifiers, saving cost and reducing complexity. The boot strap high side power supply generally designated 80 includes diode 82, resistor 84 and capacitor 86 to provide the positive floating power supply. The high gain amplifier stage 88, comprises an LM324 amplifier 90 resistors 92 and 94 and capacitor 96. Resistor 98 and zener diode 100 generate a reference voltage to bias the amplifier 90, so that bi-directional signal $V_{sig}$ can be accepted. The voltage reference $V_Z$ and the attenuation network comprising resistors 102 and 104 are chosen so that the output voltage of the amplifier 90 is at the middle of the supplied voltage (about 6 volts) when the input signal is zero. Capacitor 106 is provided to smooth voltage across zener diode 100. Low cost differential amplifier stage is configured with a second LM324 amplifier 110 and resistors 112–122.

Typical components for the circuitry of FIG. 5 are:
Resistors 50, 50a, 50b=10 ohms
Resistors 58, 66, 68, 70, 72=10 K ohms
Resistor 56=500 ohm
Capacitors 52, 52a, 52b=10 microfarad
Capacitor 60=100 picofarads
Diode 48, 48a, 48b=MUR110
Amplifiers 54, 64=LF411
Typical components for the circuitry of FIG. 6 are:
Resistor 84=10 ohms
Resistor 98=1 K ohms
Resistor 92, 104=500 ohms
Resistors 94, 102, 112, 114, 116, 118=10 K ohms
Resistor 120, 122=100 K ohms
Capacitors 86=47 microfarad
Capacitor 96=100 picofarads
Capacitor 106=10 microfarads
Diode 82=MUR110
Zener Diode 100=
Amplifiers 90, 110=LM324

While the best mode for carrying out the present invention has been described in detail, those familiar with the art to which this invention relates will recognize various alternative designs and embodiments for practicing the invention as defined by the following claims.

What is claimed is:

1. A signal conditioning circuit for receiving a floating input signal with low amplitude, and high common-mode voltage, and producing a ground referenced output signal, said input signal directly proportional to the current flowing through a sense resistor in series with an alternating current load that is powered from a voltage source through electronically controlled switching means for regulating the amplitude of the current through said load said circuit comprising:

a first stage relatively high gain single supply operational amplifier for amplifying said input signal and producing a first stage output signal;

a second stage relatively low gain single supply differential amplifier for level shifting said first stage output signal to a ground reference potential output signal; and a boot strap section connected with said voltage source and providing a positive floating power supply for said first stage amplifier which is floating with respect to ground and referenced to the same potential as said input signal, means providing a reference voltage and a voltage divider network at one input of said first stage amplifier to bias said first stage amplifier so that a bi-directional input signal can be accepted by said first stage amplifier and the output voltage of said first stage amplifier is at the middle of said source of voltage when the input signal is zero.

2. A circuit for conditioning a floating bidirectional input signal with a high common-mode voltage and producing a ground referenced output signal, said input signal directly proportional to the current flowing through a sense resistor in series with an alternating current load that is powered from a voltage source through electronically controlled switching means for regulating the amplitude of the current through said load, said circuit comprising:

a relatively high gain single ended operational amplifier stage for amplifying said input signal and producing a first stage output signal with high common mode voltage that is floating with respect to ground;

an approximate unity gain differential amplifier stage for level shifting said first stage output signal to said ground referenced output signal;

a first boot strap network connected with said source providing a floating positive supply for said operational amplifier stage; and a second boot strap network connected with said source providing a floating negative supply for said operational amplifier stage.

3. The circuit defined by claim 2 further comprising a third boot strap network providing a negative power supply for said, differential amplifier stage.

4. The circuit defined by claim 3 wherein said operational amplifier stage is an inverting amplifier having one input connected to one lead of the sense resistor, and a second input connected to the other lead of said sense resistor through a first gain setting resistor, a filter capacitor connected in parallel with a second gain setting resistor and in series between said second input and the output of said operational amplifier.

5. The circuit defined by claim 4 wherein said differential amplifier stage comprises a second operational amplifier providing an output signal referenced to ground, a voltage divider network comprising a pair of resistors connected between one lead of said sense resistor and ground, said second operational amplifier having a first input connected to the junction between said pair of resistors, having a second input connected with the output of said inverting amplifier through an input resistor and connected with the output through a feedback resistor.

6. The circuit defined by claim 5 wherein each of said boot strap networks comprises a diode, a resistor and a capacitor.

7. The circuit defined in claim 6 wherein the output of said differential amplifier stage is applied as an input to a controller that controls said switching means.

* * * * *